US008438467B2

(12) United States Patent
Blain et al.

(10) Patent No.: US 8,438,467 B2
(45) Date of Patent: May 7, 2013

(54) GRAPHICAL USER INTERFACE PROGRAM FOR FORT.15 FILE CREATION

(75) Inventors: Cheryl A. Blain, Slidell, LA (US); Robert S. Linzell, Carriere, MS (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 269 days.

(21) Appl. No.: 12/579,120

(22) Filed: Oct. 14, 2009

(65) Prior Publication Data

US 2010/0131879 A1    May 27, 2010

Related U.S. Application Data

(60) Provisional application No. 61/105,448, filed on Oct. 15, 2008.

(51) Int. Cl.
*G06F 17/00* (2006.01)

(52) U.S. Cl.
USPC ........... 715/226; 715/221; 715/222; 715/223; 715/224; 715/225

(58) Field of Classification Search ........... 715/221–226
See application file for complete search history.

(56) References Cited

U.S. PATENT DOCUMENTS

| 6,964,010 | B1 * | 11/2005 | Sharp ............................. 715/225 |
| 7,523,391 | B1 * | 4/2009 | Eizenhoefer .................. 715/224 |
| 7,620,536 | B2 * | 11/2009 | Chow ............................... 703/13 |
| 2010/0094597 | A1 | 4/2010 | Blain et al. |
| 2010/0131575 | A1 | 5/2010 | Blain et al. |

OTHER PUBLICATIONS

Lesue, Jacob Scott Lesue, Calibrating ADCIRC with tidal constituents using SMS as a preprocessor, Dept. of Civil and Environmental engineering, Aug. 2003, pp. 1-70.*
U.S. Appl. No. 61/105,448, filed Oct. 15, 2008, Unstructured Grid Coastal Modeling Tools, Cheryl Ann Blain, et al.
Notice of Allowance, U.S. Appl. No. 12/579,112, dated Sep. 22, 2011.
Makef15: An ADCIRC Model Fort.15, Input File Creation GUI for Parameter Specification and Periodic Boundary Forcing; NRL/MR/7320-079081; Naval Research Laboratory, Cheryl Ann Blain, Robert S. Linzell, Dec. 7, 2007.
Makef22:An ADCIRC Model Fort.22, Input File Creation Tool For Surface, Wind and Pressure Forcing, NRL/MR/7320-07-9082, Naval Research Laboratory, Cheryl Ann Blain, Robert S. Linzell, Brett Estrade, Dec. 7, 2007.
MeshGUI: A Mesh Generation and Editing Toolset for the Adcirc Model, NRL/MR/7322-08-9083, Naval Research Laboratory, Cheryl Ann Blain, Robert S. Linzell, T. Chris Massey, Feb. 8, 2008.

* cited by examiner

*Primary Examiner* — Andrey Belousov
(74) *Attorney, Agent, or Firm* — Amy L. Ressing; Kerry L. Broome; Kathleen Chapman (57) ABSTRACT

An initialized graphical user interface program can produce a plurality of parameter input fields in a graphical user interface. The plurality of parameter input fields can be logically grouped with similar parameter input fields in close approximation to each other in the graphical user interface. The graphical user interface program can then receive a plurality of parameter data from a user can input into the parameter input fields of the graphical user interface program. Based on the received user input parameter data, the graphical user interface program can deactivate one or more parameter input fields. The graphical user interface program can error-check the received input data and provide warnings for any incorrect data. Finally, the graphical user interface program can generate a fort.15 input file based on the parameter input data.

4 Claims, 7 Drawing Sheets

GRAPHICAL USER INTERFACE PROGRAM FOR FORT.15 FILE CREATION

CROSS-REFERENCE TO RELATED APPLICATIONS

This application claims priority to provisional patent application entitled, "Unstructured Grid Coastal Modeling Tools," filed on Oct. 15, 2008, and assigned U.S. application No. 61/105,448; the entire contents of which are hereby incorporated by reference.

FIELD OF THE INVENTION

The invention relates generally to graphical user interface (GUI) software. More specifically, the invention relates to a graphical user interface programmed to create a fort.15 text file containing relevant information for a computer model simulation of the coastal ocean.

BACKGROUND

ADCIRC is a system of computer programs that solve time dependent, free surface circulation and transport problems in two and three dimensions. The equations discretized within the ADCIRC model are often used to represent coastal ocean dynamics. Typical ADCIRC applications have included: (i) modeling tides and wind driven circulation, (ii) analysis of hurricane storm surge and flooding, (iii) dredging feasibility and material disposal studies, (iv) larval transport studies, (v) near shore marine operations.

Execution of such a model requires the specification of many model parameters and physical forcing values. For example, the fort.15 file, a file specific to the ADCIRC model nomenclature, is a text file containing all of the relevant, and required, information for a computer model simulation of the coastal ocean. The relevant information includes many different parameters and forcing specifications, which are typically required for all coastal ocean models. Typically, the process of preparing the fort.15 file is extremely tedious and time-consuming because of the large amount of information and highly specific formats that are required.

Accordingly, there remains a need for a method or system that provides a user with an interface within which to specify the parameters and forcings required for a numerical simulation of the coastal ocean. The interface should logically categorize necessary information, provide details on the meaning and appropriate specification of each parameter, and check for inconsistencies in parameter specification.

SUMMARY OF THE INVENTION

To date, the creation and modification of an ADvanced CIRCulation (ADCIRC) Model Parameter and Periodic Boundary Forcing File (e.g., fort.15 file) have been overly burdensome because of the many model parameters and physical forcing values that are required to execute the model. The invention satisfies the above-described need by providing a method or system that provides a user-friendly interface that logically groups together related parameters to allow a user to specify the parameters and forcings required for a numerical simulation of the coastal ocean.

According to one aspect of the invention, an initialized graphical user interface program can produce a plurality of parameter input fields in a graphical user interface. The plurality of parameter input fields can be logically grouped with similar parameter input fields in close approximation to each other in the graphical user interface. The graphical user interface program can then receive a plurality of parameter data from a user that can input into the parameter input fields of the graphical user interface program. Based on the received user input parameter data, the graphical user interface program can deactivate one or more parameter input fields. The graphical user interface program can error-check the received input data and provide warnings for any incorrect data. Finally, the graphical user interface program can generate a properly formatted fort.15 input file based on the parameter input data.

For another aspect of the invention, a user can initiate a graphical user interface program, wherein the graphical user interface program provides a plurality of parameter input fields in a graphical user interface. The plurality of parameter input fields can be logically grouped with similar parameter input fields in close approximation to each other in the graphical user interface. A user can then input a plurality of parameter data into the plurality of parameter input fields, and the graphical user interface program can error-check the inputted data. Finally, the user can receive a fort.15 input file produced by the graphical user interface program based on the plurality of input parameter data.

These and other aspects, objects, and features of the present invention will become apparent from the following detailed description of the exemplary embodiments, read in conjunction with, and reference to, the accompanying drawings.

DETAILED DESCRIPTION OF EXEMPLARY EMBODIMENTS

Referring now to the drawings, in which like numerals represent like elements, aspects of the exemplary embodiments will be described in connection with the drawing set.

ADCIRC is a highly developed computer program for solving the equations of motion for a moving fluid on a rotating earth. ADCIRC can be run either as a two-dimensional depth integrated (2DDI) model or as a three-dimensional (3D) model. In order to run the computer program, a plurality of input files are utilized. One of these files, the Model Parameter and Periodic Boundary Forcing File, or fort.15 file, contains the majority of the parameters required to run both the 2DDI and 3D versions of ADCIRC model, and the information to drive the model with harmonic boundary conditions (either elevation or flux). The fort.15 file contains lines and lines of input data, and is required to run the ADCIRC model.

The present invention provides a graphical user interface that is configured to create a new, or modify an existing, fort.15 file, which can subsequently be input into the ADCIRC model. The graphical user interface program is a window-based, platform-independent Perl script. Other instructions for installing and initializing the graphical user interface program are known to one of ordinary skill in the art.

Though it can be accomplished by other means, the best method for starting the graphical user interface program is from a command line in a command prompt, or terminal window. A user can determine an appropriate working directory and verify that all the required files necessary to implement the graphical user interface program are present. If an existing fort.15 file is located in the user's current working directory, the graphical user interface program can read that fort.15 file after generating the graphical user interface. This action would be utilized when modifying an existing fort.15 file, where the pre-existing parameter files from the existing fort.15 file would be used to fill the parameters in the graphical user interface. If a fort.15 file is not already present, the graphical user interface program can load default values for the parameters and create a new fort.15 file.

Figure 1:
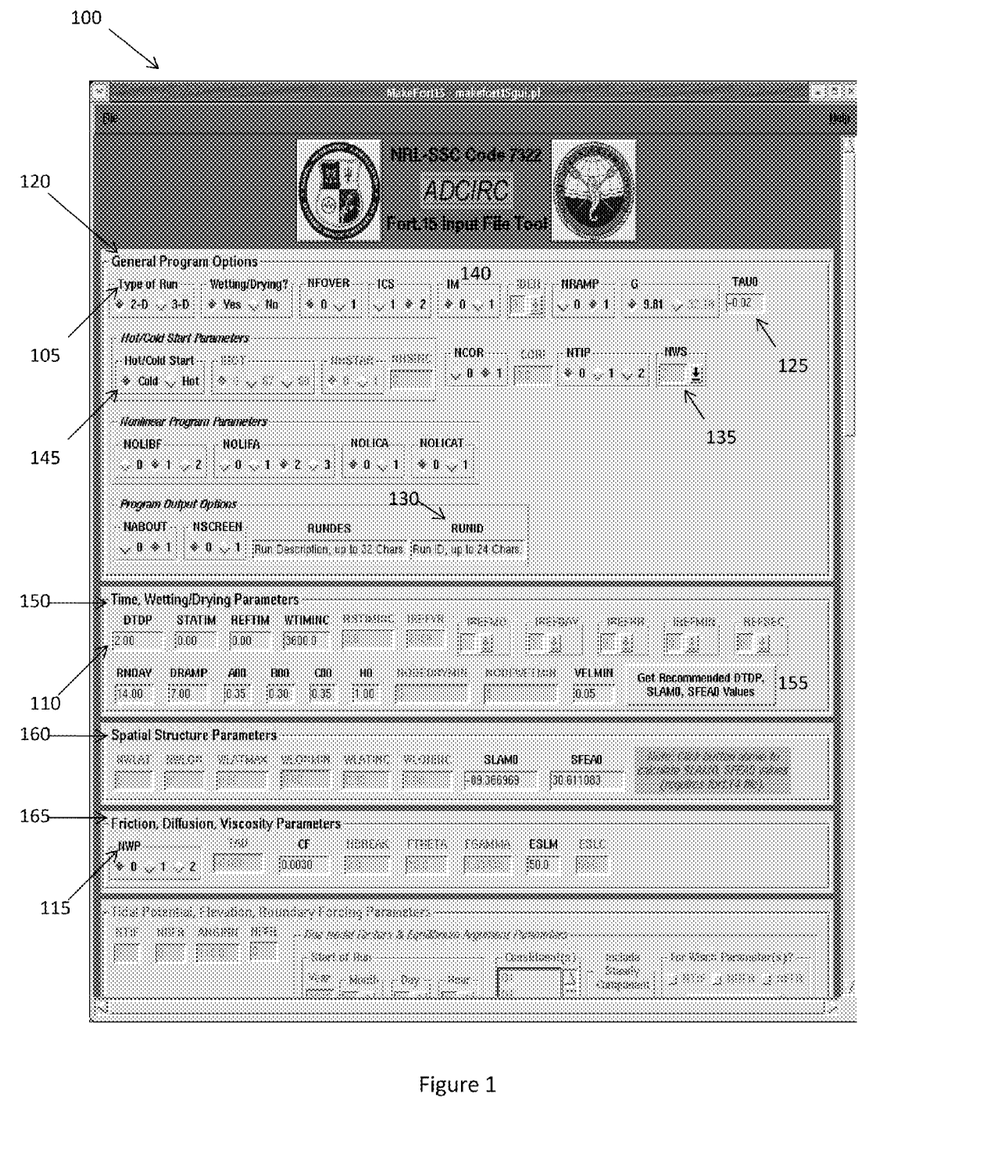
FIGS. 1, 2, and 3 are sequential views of an example user interface display in accordance with an exemplary embodiment of the invention.
Figure 2:
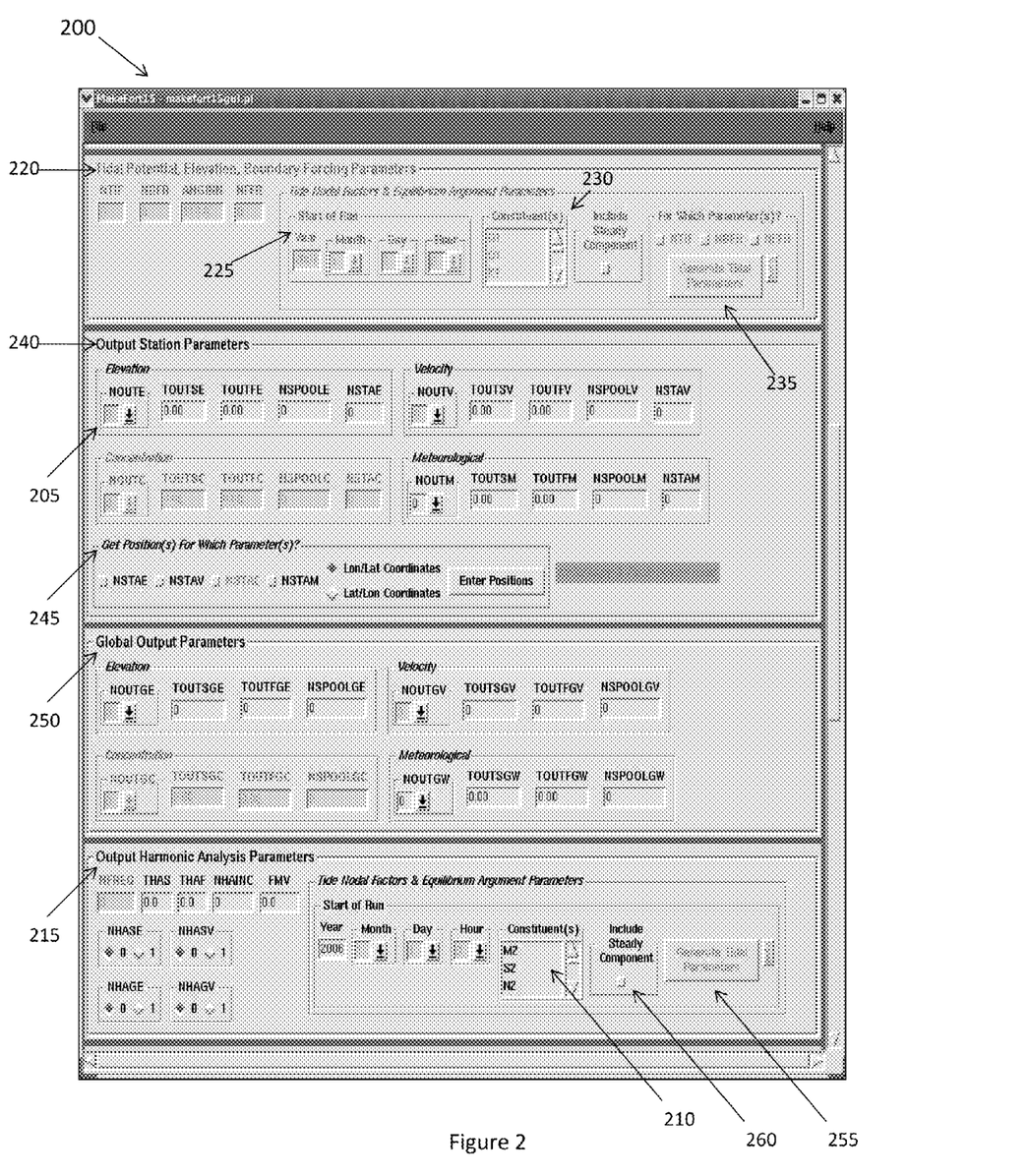
Figure 3:
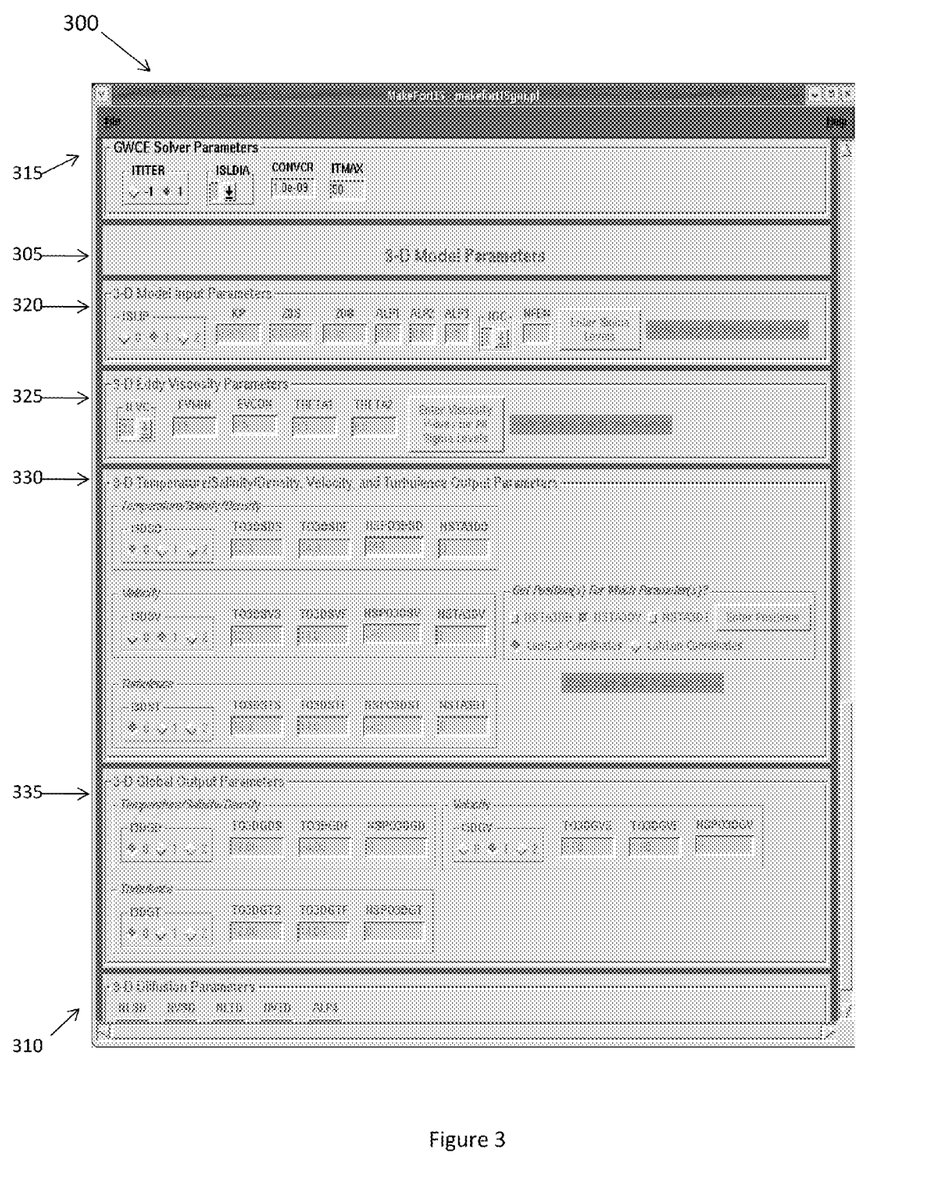

FIGS. 1, 2, and 3 are sequential views of an example user interface display in accordance with an exemplary embodiment of the invention. Navigation within the graphical user interface program is typical for other window-based applications. For example, using the mouse or other pointing device, or by using the keyboard (i.e., the four arrow keys, Tab key, Page Up and Page Down keys). Furthermore, menu items also can be navigated in the standard way using the mouse or keyboard (e.g., Alt-F to select the File menu, then O to select the Open menu item).

As represented in FIGS. 1-3, the graphical user interface program comprises many different parameters as represented by the multiple text boxes, radio buttons, and drop-down boxes. These parameters contain the relevant information that is needed to create a fort.15 file. The parameters can be logically grouped with similar content into separate panels. The logically grouped panels provide a user-friendly interface so that a user can recognize certain parameter types without having to "jump around" to different types.

Figure 4:
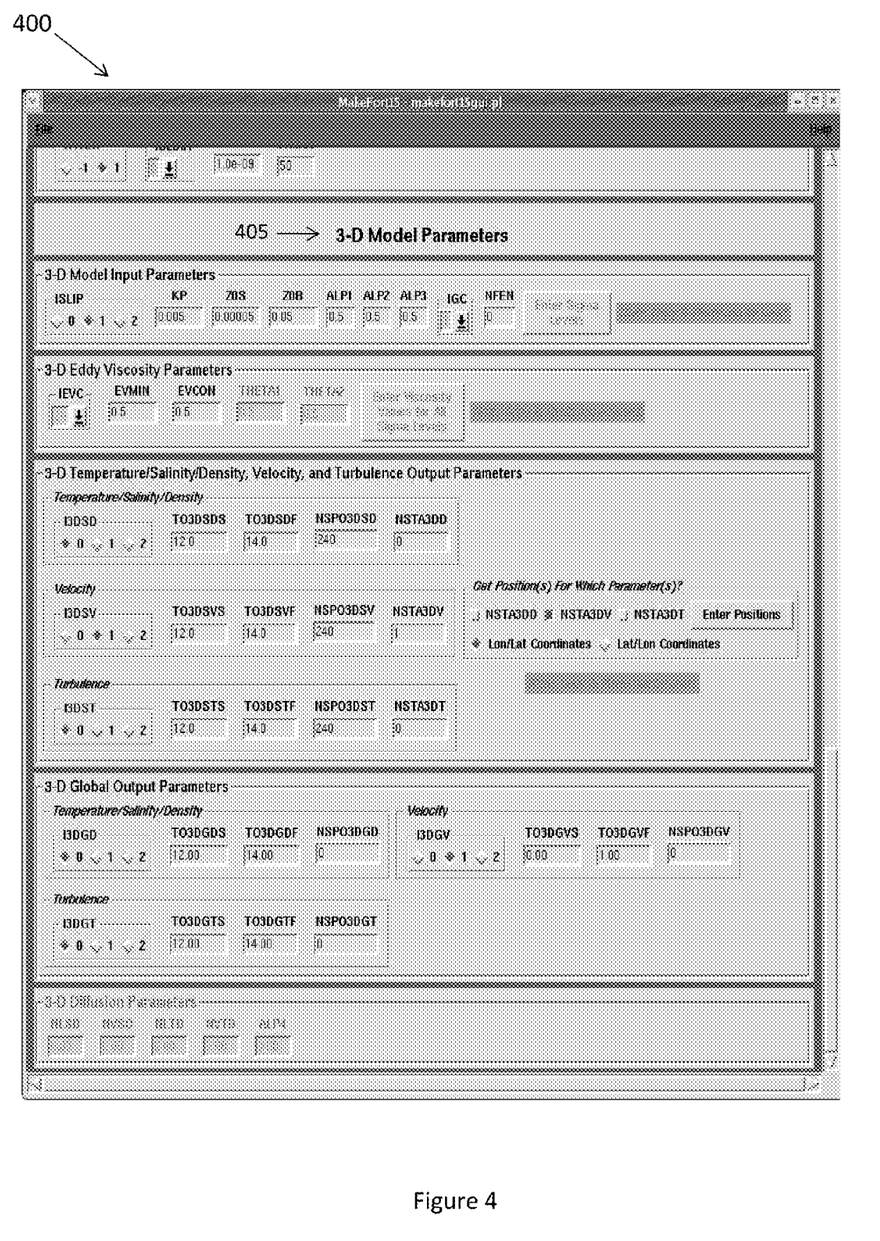
FIG. 4 is another example user interface display in accordance with an exemplary embodiment of the invention.

Many of the parameters within the graphical user interface are relationally driven, that is parameters are disabled or enabled depending on the values of related parameters. For example, when the "Type of Run" selection box 105 in FIG. 1 has the 2-D option selected, the 3-D model parameters 305 are disabled, or "grayed out," as represented in FIG. 3. Logically, changing from a 2-D selection to a 3-D selection in the box 105 enables the 3-D model parameters 305 and any other related parameters that are above the 3-D section, as represented in FIG. 4. Though it may be difficult to distinguish in the black-and-white drawings, the 3-D model parameters 405 in FIG. 4 are not disabled, or "grayed out" as they were in FIG. 3.

In the graphical user interface program, there are numerous other instances in which the values of certain parameters activate or deactivate other related parameters. The logic that governs when certain parameters are disabled or enabled based on the values of other parameters is derived from the parameter inter-relationships that are discerned from the parameter definitions found in the official ADCIRC model documentation at http://www.adcirc.org/.

The graphical user interface program contains several different types of graphical user interface elements, or "widgets," for various parameters. The graphical user interface elements include text box entries in which the user modifies or replaces the value in the box. Acceptable values for these text box entries can span the range of arbitrary text, floating point, and integer values. One example of a text box is represented by the "DTDP" box 110 in FIG. 1. Other parameters which must be selected from a list of several specific values can have a pull-down list of values from which to select. One example of this type of widget is the "NOUTE" pull-down list 205 in FIG. 2. For the pull-down list elements, the user clicks on the underlined arrow icon on the right side of the widget, and the list appears with the available values. The user selects the desired value, and the list disappears with the chosen value displayed in the widget.

The graphical user interface program also contains parameters which can take one or more values from a list of values, as represented by the "Constituent(s)" box 210 in FIG. 2. This type of widget is represented by a list of one or more values that can be selected with the mouse by clicking, shift-clicking, or control-clicking, as appropriate. As an example, in the "Constituent(s)" box 210, a user can select value "M2" and while holding the CTRL-key, also select value the non-adjacent value, "N2" with the mouse (i.e., control-clicking).

The graphical user interface program also utilizes radio buttons for parameters that require a selection of one value from among two or more represented values. For radio button widgets, when one value is selected, the others are automatically deselected. An example of a radio button widget is represented by the "NWP" box 115 in FIG. 1 under the Friction, Diffusion, and Viscosity Parameters panel. The value of "NWP" can equal 0, 1, or 2; therefore, these three choices with corresponding radio buttons are shown in "NWP" box 115. In FIG. 1, "NWP" has been set to value, 0, so the other values of "NWP" (1 and 2) are deselected.

Figure 5:
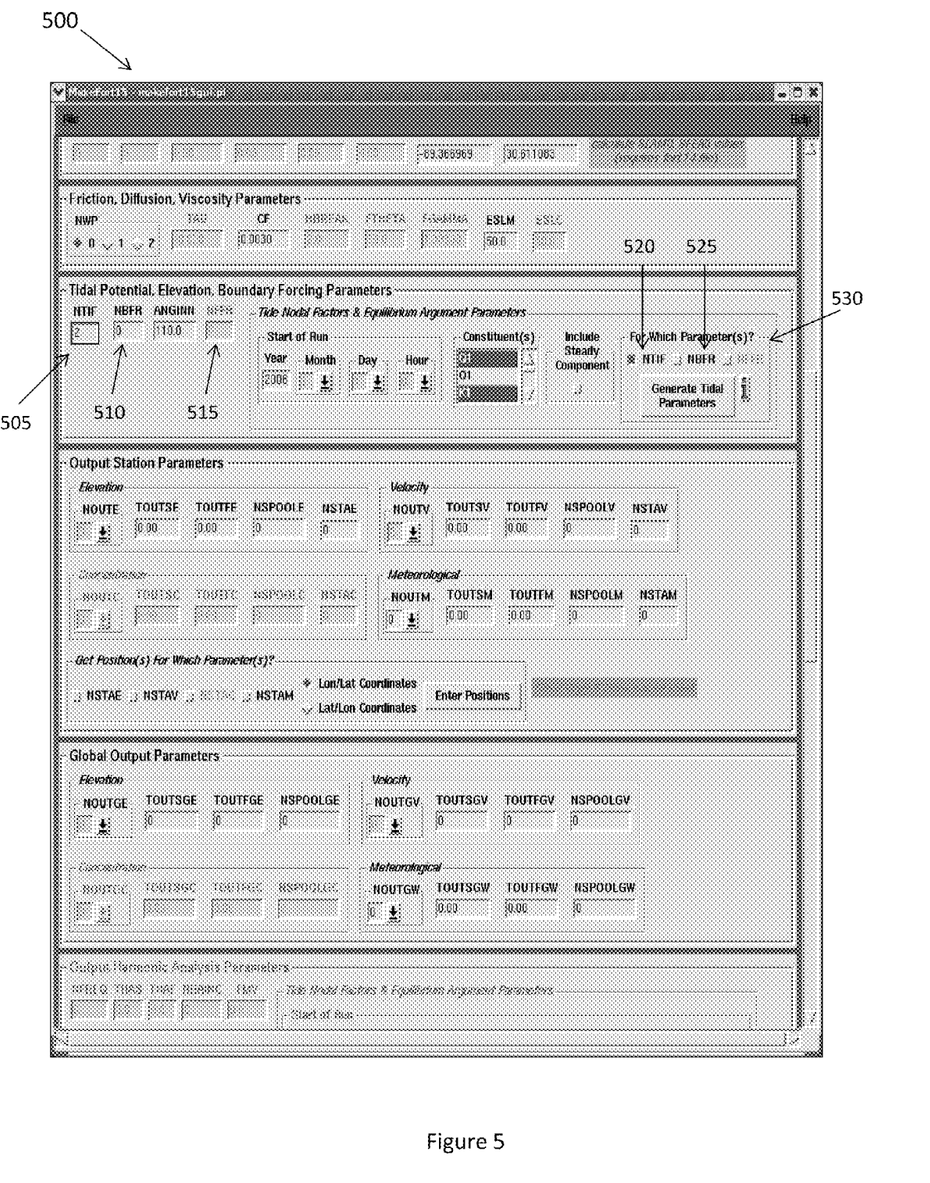
FIG. 5 is another example user interface display in accordance with an exemplary embodiment of the invention.

Several types of parameters can be enabled or disabled, respectively, by selecting or deselecting checkboxes prior to performing some operation. For example, FIG. 5 represents three checkboxes for "NTIF" 520, "NBFR" 525, and "NFFR" 530, respectively, above the button labeled, "Generate Tidal Parameters." The checkbox for "NTIF" 520 has been selected since "NTIF" has a value of "2" as represented in the "NTIF" box 505. The checkbox for "NBFR" 525 has been deselected since "NBFR" has a value of "0" as represented in the "NBFR" box 510. The checkbox for NFFR 530 has been deactivated, as has the text entry box for NFFR 515 as a result of the boundary information within the grid file (fort.14) since has triggered deactivation of the NFFR parameter.

Finally, some parameters are comprised of arrays of values, such as station coordinates, or sigma levels. For these parameter types, a text entry widget is used. This type of widget allows the user to enter values manually, copy and paste the values from another window (e.g., a text editor), or input the values from an existing ASCII text file. Columnar data can be comma-delimited or space-delimited. The entry widgets have brief messages describing the options.

FIG. 1 is an example view of the first portion of the example user interface display in accordance with an exemplary embodiment of the invention. The topmost panel in FIG. 1 is labeled General Program Options 120. As the name implies, this panel contains many of the general options that control how the ADCIRC model is run, such as whether a 2-dimensional (2-D) or a 3-dimensional (3-D) run is to be executed. Other option groups within this panel include Hot/Cold Start parameters, Nonlinear Program parameters, and Output Option parameters.

The General Program Options panel 120 contains three types of graphical user interface elements, or "widgets." The first is the radio button, which is a set of two or more toggling buttons grouped together where only one button can be selected. This type of widget is represented by the "Type of Run" buttons 105. In FIG. 1, for example, the "Type of Run" buttons 105 allow the user to select either 2-D or 3-D model operation, but not both. The next type of widget is the text entry box. This is a text box in which a value or string is displayed, and the user can replace or modify the existing value or string. In FIG. 1, examples include the TAU0 value box 125 and the RUNID text string box 130. The third type of widget represented in the General Program Options panel 120 is the pull-down list. This is a combination of a button with an underlined arrow, a list of available values that appears when the button is activated (clicked), and a text box that displays the current value of that parameter. All of the pull-down lists have been configured so that the user cannot enter a value, but can only select from the list. In FIG. 1, the NWS parameter 135 employs a pull-down list.

One of the primary features of the graphical user interface program is that the inter-relational control of parameters is accommodated. For example, the inter-relational control prevents a user from having knowledge of the different relational parameters. Therefore, a user can make his/her selections and the graphical user interface program can be responsible for determining which additional parameters are required and which ones are not.

For example, in FIG. 1, for example, the Type of Run options 105 control the values of IM 140 and the Hot/Cold Start Parameters 145, as well as the availability of the Output Harmonic Analysis Parameters 215 in FIG. 2 and the 3-D Model Parameters 305 sections in FIG. 3. If the default "2-D" Type of Run is selected in 105, then IM 140 is set to 1, and the Hot/Cold Start option 145 is enabled. The Output Harmonic Analysis Parameters 215 are also enabled, but the entire 3-D Model Parameters section 305 is disabled. On the other hand, if the "3-D" Type of Run 105 is selected, then IM 140 is set to 0, the Hot/Cold Start Parameters are disabled, the Hot/Cold Start option 145 is set to Cold, and IHOT and NHSTAR are set to 0. Similarly for selection of the "3-D" Type of Run, Output Harmonic Analysis Parameters 215 are disabled, and the entire 3-D Model Parameters section 305 is enabled, except for the 3-D parameters which are controlled by other parameters, e.g., the 3-D Diffusion Parameters 310.

Figure 6:
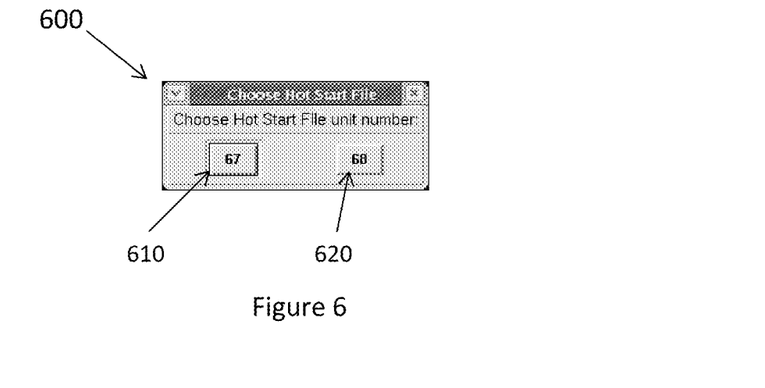
FIG. 6 is an example user prompt for the Hot Start File unit number in accordance with an exemplary embodiment of the invention.

Considering the Hot/Cold Start Parameters, if the Hot/Cold Start option 145 is enabled and the user selects Hot, a pop-up window can appear prompting the user to select the Hot Start file unit number. The user must then select either the 67 box 610 or the 68 box 617, which determines the unit number of the file, fort.67 or fort.68, respectively, to be read in for initialization of the hot start model run. An example of the pop-up window representing the user prompt for the Hot Start File unit number is represented in FIG. 6.

The Time, Wetting/Drying Parameters Panel 150 contains parameters that specify the model time step, start and reference times, durations of the model run and ramping function, and select various wetting and drying options available within the model. Most of these parameters are accessed via text entry boxes, and can therefore accept any reasonable values. Some reference time parameters are selected from pull-down lists. Activation for most of these reference time parameters depends on the value of NWS.

In addition, the Time, Wetting/Drying Parameters panel 150 can include a large, rectangular button 155 labeled, "Get Recommended DTDP, SLAM0, SFEA0 Values." A user can click on this button to perform calculations to estimate the time step size, DTDP, required to meet the Courant-Friedrichs-Lewy (CFL) stability condition. The time step estimate assumes a tidal propagation speed equal to the sqrt (gH) where g is the acceleration of gravity and H is the water depth and requires a CFL value of 0.6 or less. The CFL is computed for this case as the tidal propagation speed (assuming an $M_2$ frequency tide) multiplied by the time step and divided by the mesh spacing. Mesh spacing is estimated by the length of a triangle side assuming a triangle of the same area is equilateral. A user can also compute geometric mean values for the central longitude (SLAM0) and latitude (SFEA0) of a particular domain. Such values can identify the centroid location for the CPP coordinate transformation. If ICS is set to 1 (indicating Cartesian coordinates), calculated CPP centroid coordinates are not available since the CPP transformation is unnecessary. Once time step and centroid calculations are complete, a pop-up window can appear that prompts the user to decide whether or not to replace current values of DTDP and SLAM0 and SFEA0, if ICS is set to 2 (indicating spherical coordinates).

Figure 7:
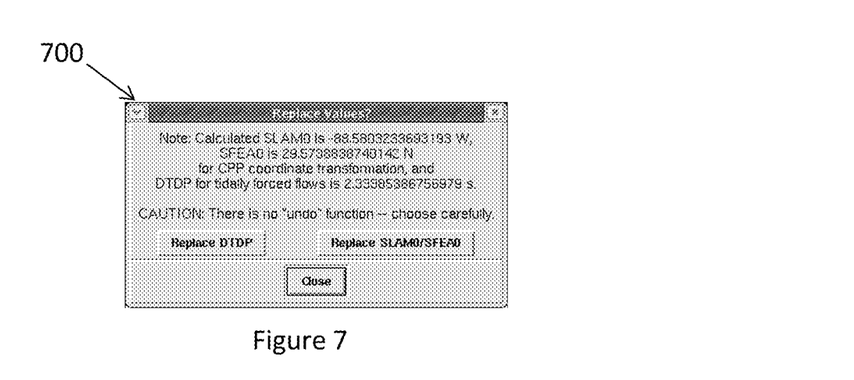
FIG. 7 is an example user prompt for the replacement of the time step, DTDP, and centroid of a CPP projection in accordance with an exemplary embodiment of the invention.
Figure 8:
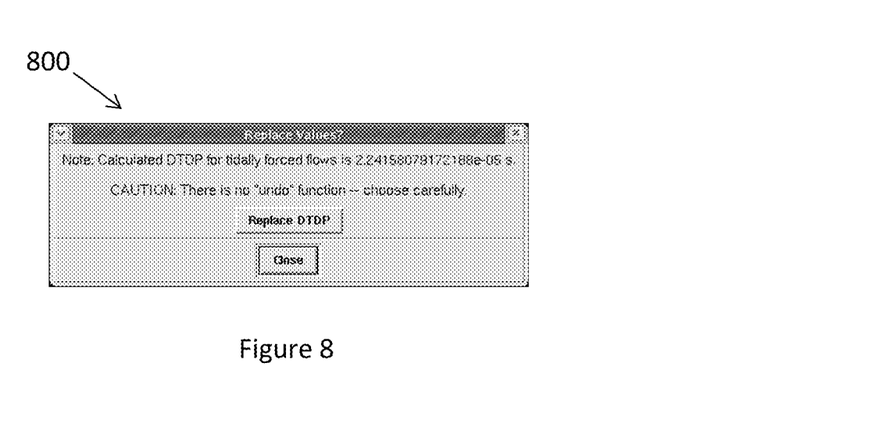
FIG. 8 is an example user prompt for the replacement of the time step, DTDP, in accordance with an exemplary embodiment of the invention.

FIG. 7 is an example user prompt for the case in which the value of ICS is "2" and all three parameters have been computed and are available to replace default values. FIG. 8 is an example user prompt for the case in which the value of ICS is "1" and only the time step, DTDP, can be replaced. If the user chooses to replace the existing values, the newly computed values appear in place of the previous values. Otherwise, the existing values are retained.

FIG. 1 also represents the Spatial Structure Parameters Panel 160, which contains dimensional parameters describing the structure of the meteorological forcing file activated for certain values of NWS. This panel also contains the centroid coordinates of the projection for the CPP coordinate transformation. As described previously, CPP center coordinates can be calculated only if ICS is set to a value of "2" (spherical coordinates) and a fort.14 file has been read. The user can, however, manually modify the values SLAM0 and SFEA0 regardless of the value of ICS, though for ICS set to 1, these values are ignored. All of the parameters in this panel can be contained in text entry boxes.

The Friction, Diffusion, Viscosity Parameters Panel 165, represented in FIG. 1, contains a set of radio buttons and several text entry boxes for bottom friction, horizontal eddy viscosity and transport diffusivity parameters. These parameters are enabled or disabled based on the values of IM and NOLIBF in the General Program Options panel 120.

As represented in FIG. 2, the Tidal Potential and Periodic Elevation/Flux Boundary Forcing Parameters Panel 220 contains text entry boxes for four of the relevant fort.15 file parameters, and several widgets for generating the remaining periodic (tidal) forcing parameters. The four text entry boxes contain the values of, respectively, NTIF, NBFR, ANGINN, and NFFR. Changing the value of NTIF, NBFR, or NFFR, if enabled, also selects or deselects (if zero) the checkboxes on the right side of the panel. A value of zero for NTIP automatically assigns a zero value to the NTIF parameter.

To perform tidal parameter calculations, the date and time assigned by the user to the start of the ADCIRC model run are entered using the widgets in the Start of Run sub-panel 225. The year is entered manually, and must be between 1900 and 2100, inclusive. The default year is the current system year at the time the GUI is started. The month, day, and hour are selected from pull-down lists. The defaults for these are 00 hours on January 1.

Once the Start of Run parameters in sub-panel 225 have been set, the tidal constituents 230 can be selected. Nine constituents are available (though not all visible in FIG. 2), including the principal diurnal and semi-diurnal components. The steady component also can be included by selecting the indicated checkbox. Note that if the steady component is included, the values of NBFR and/or NFFR are automatically incremented by 1. The steady component is not available to the tidal potential forcing option. At least one constituent (not including the steady component) must be selected from the scrolling list. If more than one constituent is needed, the user can click on the first constituent, and then shift-click (press the Shift key and then click) on the last needed constituent to select all from the first to the last. If non-adjacent constituents are needed, the user can control-click (press the Control key and then click) on the desired constituents.

After all desired constituents are selected in box 230, the user can click the Generate Tidal Parameters button 235 to generate the tidal parameters. This user click can execute one or more standalone, external Fortran 90 tidal programs that one of ordinary skill in the art would understand. Only the tidal parameters corresponding to the selected checkboxes for NTIF, NBFR, or NFFR are generated after the user clicks the Generate Tidal Parameters button 235. If, for example, the checkbox for NTIF is selected and the others are deselected, then only the parameters TPK, AMIGT, ETRF, FFT, and FACET are generated. Similarly, if only the checkbox for NBFR is selected, then only the parameters AMIG, FF, FACE, EMO, and EFA are generated. If the checkboxes for both NTIF and NBFR are selected, then all of these parameters can be generated.

As a way of implementing error checking into the graphical user interface program, if the user selects checkboxes for any of NTIF, NBFR, or NFFR on the right side of the panel and there is a discrepancy between the values of NTIF, NBFR, or NFFR and the number of selected constituents for the activated checkboxes, or if the user neglects to select any constituents, an error message can appear. The user can be advised to correct the situation, and try again. Note that the user can perform tidal calculations for each of the NTIF, NBFR, and NFFR parameters individually by selecting only the desired checkbox at the right of the panel. In this case, a consistency check is only applied to that parameter for which tidal parameter calculations are indicated. This action can be repeated for each parameter, NTIF, NBFR, and NFFR as desired. This allows the specification of different numbers and names of constituents for each of the tidal potential (NTIF), elevation (NBFR) or flux (NFFR) period boundary forcing parameters.

The Output Station Parameters Panel 240, in FIG. 2, can contain the parameters necessary to activate the output of available model variables at specific locations or stations. The format, time window, frequency, number of stations, and station locations can be specified for elevation, current velocity, and, if enabled, meteorological and concentration time series. The output format flags (NOUTE, NOUTV, NOUTC, and NOUTM) are selected from pull-down lists, while the remaining parameters are specified in text entry boxes. If the number of stations for the different variables is nonzero, then the station locations can be manually input by using a Position Entry Form as shown in FIG. 9.

Figure 9:
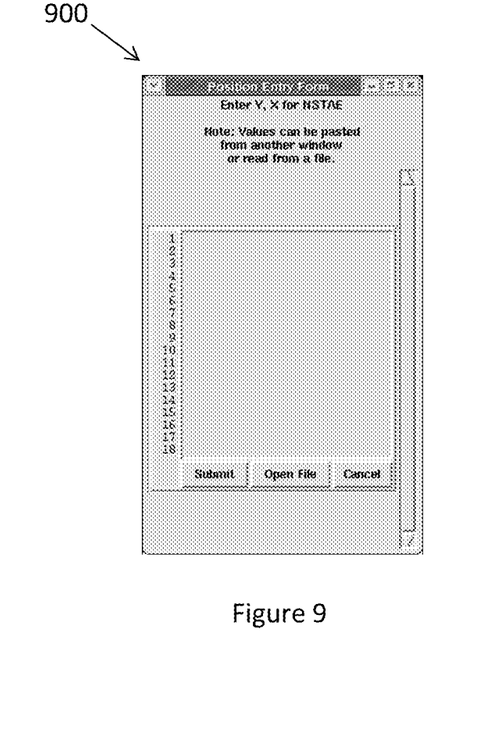
FIG. 9 is an example Position Entry Form for the specification of station location coordinates for the station output in accordance with an exemplary embodiment of the invention.

The Position Entry Form 900 of FIG. 9 can have the same number of input lines as user- specified stations. If the user manually enters the positions, the coordinates are entered as a comma- delimited or space-delimited pair on each line. As the note in the Position Entry Form 900 indicates, the user can also copy the coordinate values from another window and paste them into this Position Entry Form 900, or provide the name of an ASCII text file name from which the coordinates are subsequently read. Once all coordinates have been entered, either manually, by copy-and-paste, or file read, the user can click the Submit button to complete the operation.

As seen in FIG. 2, the Get Position(s) for Which Parameter (s) sub-panel 245 contains radio buttons to specify the order of the coordinates, either longitude followed by latitude, or latitude followed by longitude. The value of ICS, located in the General Program Options Panel 120 in FIG. 1 controls whether the coordinates are degrees of longitude/latitude or Cartesian (i.e., X/Y distances). Depending on the value of ICS, wording in the graphical user interface and associated widget can change to reflect the coordinate type.

Additionally, note that in the Output Station Parameters Panel 240, the availability of the Meteorological sub-panel is controlled by the value of NWS, and availability of the Concentration sub-panel is controlled by the value of IM.

The Global Output Parameters Panel 250 can contain parameters controlling model output from the entire model grid. As for the Output Station Parameters panel 240, the output format flags are specified using pull-down lists, and the remaining parameters are specified in text entry boxes. Since the Global Output Parameters 250 apply to the all points comprising the grid, no input of coordinate locations is necessary. Similar to the Output Station Parameter panel 240, the Meteorological output sub-panel is controlled by the value of NWS, and the Concentration sub-panel is controlled by the value of IM.

The Output Harmonic Analysis Parameters Panel 215, represented in FIG. 2, can contain parameters associated with harmonic analysis of the model results. Note that availability of this panel is controlled by the Type of Run option 105 in FIG. 1. If Type of Run is set to 2-D, the default value, the panel is enabled; however, if set to 3-D, it is disabled. This panel 215 has only one parameter specifying the number of tidal constituents (NFREQ), so the "Generate Tidal Parameters" button 255 need only be activated once. The text entry box for NFREQ is controlled by the values of NHASE, NHASV, NHAGE, and HHAGV. If any of these parameters is set to 1, then NFREQ is enabled. If NFREQ is set to a value greater than zero, then the Generate Tidal Parameters button 255 is enabled. For the harmonic analysis option, up to thirty-seven (37) tidal constituents are available under the "Constituents" pull-down menu 210 and operation of the Output Harmonic Analysis Parameters panel 215 is the same as for the Tidal Potential and Periodic Elevation/Flux Boundary Forcing Parameters Panel 220. The steady component also can be included by selecting the indicated checkbox 260.

The GWCE Solver Parameters panel 315 can contain parameters controlling the type of solver to be used for the generalized wave-continuity equation (GWCE). The value of ITITER is selected by clicking one of the two radio buttons. The value of ISLDIA is selected from a pull-down list and the two remaining parameters, CONVCR and ITMAX, are specified using text entry boxes.

The 3-D Model Parameter panel 305 can serve as a divider between the upper portion of the GUI, with general and 2-D-specific parameters, and the lower portion containing 3-D model specific parameters.

The 3-D Model Input Parameters panel 320 can contain input parameters for the 3-D model option pertaining to the bottom slip condition and the vertical sigma coordinate grid. The value of ISLIP can be selected from among three radio buttons. The value of IGC can be selected from a pull-down list, and the remaining parameters in this panel can be specified using text entry boxes. The Enter Sigma Levels button can be enabled or disabled according to the value of IGC. If enabled, the user can enter the sigma levels using a Data List Entry Form, not shown. This entry form is similar to the Position Entry Form 900 represented in FIG. 9, where the user can manually enter the values, copy values from another window and paste them into the form, or read values from a user-specified ASCII text file.

The 3-D Eddy Viscosity Parameter panel 325 can contain parameters related to vertical eddy viscosity and turbulence calculations. The value of IEVC is selected from a pull-down list. The values of EVMIN and EVCON are specified in text entry boxes. The value of IEVC also controls the text entry boxes for THETA1 and THETA2, as well as the button labeled, "Enter Viscosity Values for All Sigma Levels." In a manner similar to the sigma level entry described above, a Data List Entry Form can be used to enter eddy viscosity values associated with each sigma level.

The 3-D Temperature/Salinity/Density, Velocity, and Turbulence Output Parameters Panel 330 can contain parameters that control the time series output of 3-D model variables at user-specified locations or stations. These parameters are analogous to the 2-D versions described previously. The output format flags are specified by selecting radio buttons. The other parameters are specified in text entry boxes. The coordinates of the output stations are entered using the Position Entry Form 900 represented in FIG. 9 for either latitude/longitude coordinates or X/Y coordinates. As previously described, the order of the coordinates is specified by selecting the appropriate radio button. Wording of the Get Position (s) for Which Parameter(s) sub-panel and the Position Entry Form 900 reflect the coordinate system specified by the value of ICS as noted previously.

The 3-D Global Output Parameters Panel 335 can contain parameters for the control of time series output of model variables for the entire model grid (all nodes). As for the Temperature/Salinity/Density, Velocity, and Turbulence Output Parameters Panel 330, the output format flags can be specified using radio buttons, and the remaining parameters can be contained in text entry boxes. Since the 3-D Global Output parameters 335 cover the entire grid, there is no input of station coordinates.

Finally, the 3-D Diffusion Parameters Panel 310 can contain four parameters specifying lateral and vertical diffusion parameters for salinity (NLSD and NVSD, respectively) and temperature (NLTD and NVTD, respectively), as well as a time stepping parameter (ALP4). All can be specified using text entry boxes. Availability of these widgets can be controlled by the value of IDEN.

Figure 10:
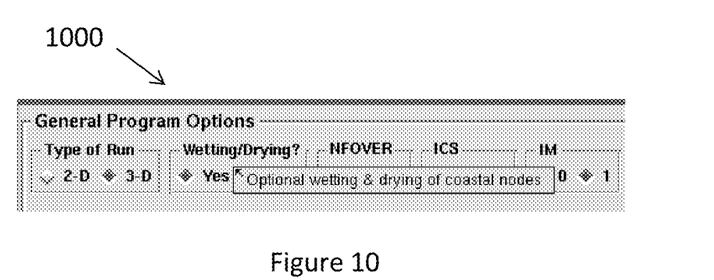
FIG. 10 is an example Tool Tip help feature in accordance with an exemplary embodiment of the invention.

The graphical user interface program can include a comprehensive help facility to assist a user with the multiple parameters and input locations. For example, all model parameters and buttons, and numerous descriptive labels, can have "Tool Tips" (also known as "Bubble Help"). For the "Tool Tips," when a mouse pointer is placed over the item of interest, a small window can appear near the pointer with a brief description of the item. FIG. 10 represents an example Tool Tip help feature for the Wetting/Drying model option located in the General Program Options Panel 120.

Similar to the help feature described above, many parameters can also include hyperlinks to Help pages. If additional information is available for a particular parameter that is shown in the Tool Tip, the user can click on the parameter name and a pop-up window (not shown) can appear with descriptive text for that parameter and a note informing the user to click on a hyperlink for additional details. After clicking on a hyperlink, an additional pop-up window can appear with additional help information. The help information can include details that are derived from the ADCIRC model.

Other helpful information can be made available for each of the Panels, Tidal Potential and Periodic Elevation/Flux Boundary Forcing Parameters and Output Harmonic Analysis Parameters by providing an information button, that can be indicated by an "i" label. If a user clicks on an "i" button, a pop-up window (not shown) can appear with explanatory text. The text for the "i" buttons can be contained within ASCII text files. If a text file is not found upon startup of the graphical user interface program, a notification can appear instead of the explanatory text (not shown) when the information button is clicked. If this occurs, the user can attempt to locate the text file in the working directory.

Finally, in addition to the Tool Tips and hyperlinked Help, a Help item in the menu bar can be provided that can open a web browser with the ADCIRC on-line fort.15 documentation information (found at http://www.adcirc.org/).

The graphical user interface program can also contain extensive error checking abilities that can be built into the program so that erroneous values are either not possible or are identified before the fort.15 file is written. The radio buttons and pull-down lists can be configured so that only the values that are shown can be selected. Additionally, consistency checks are performed where possible for user-entered parameters that are related to other user-entered parameter (e.g., the number of tidal constituents desired vs. the number of selected constituents).

Previous examples have been discussed, but in general, for instances where there is a discrepancy in expected values, the graphical user interface program can display a warning message (not shown) notifying the user of the mistake and requesting that the user correct the discrepancy. In addition to number discrepancies, warning messages can be provided when a user enters non-numerical values into entry boxes that require floating point or integer values. The ADCIRC program also performs checks on the input values, so invalid or nonsensical parameter values are often be caught before the model execution begins.

The invention comprises a computer program that embodies the functions described herein and illustrated in the appended flow charts. However, it should be apparent that there could be many different ways of implementing the invention in computer programming, and the invention should not be construed as limited to any one set of computer program instructions. Further, a skilled programmer would be able to write such a computer program to implement an exemplary embodiment based on the flow charts and associated description in the application text. Therefore, disclosure of a particular set of program code instructions is not considered necessary for an adequate understanding of how to make and use the invention. The inventive functionality of the claimed computer program will be explained in more detail in the following description read in conjunction with the figures illustrating the program flow.

It should be understood that the foregoing relates only to illustrative embodiments of the present invention, and that numerous changes may be made therein without departing from the scope and spirit of the invention as defined by the following claims.

The invention claimed is:

1. A method for creating a file in a fort.15 format, comprising the steps of:
   initiating, by a user, a graphical user interface program, wherein the graphical user interface program provides a plurality of parameter input fields in a graphical user interface;
   inputting, by the user, a plurality of parameter data into the plurality of parameter input fields;
   generating the file in the fort.15 format based on the parameter data;

accessing, by the user, the file in the fort.15 format produced by the graphical user interface program based on the plurality of parameter data; and automatically estimating a time step size required to meet a stability condition.

2. The method of claim 1, wherein the step of producing a plurality of parameter input fields in a graphical user interface further comprises the step of logically grouping similar parameter input fields in close approximation to each other in the graphical user interface.

3. The method of claim 1, further comprising the step of deactivating one or more parameter input fields based on the received user input parameter data.

4. The method of claim 1, further comprising the steps of:

receiving a screen location of a mouse pointer; and displaying a help window associated with the parameter input field located at the screen location.

* * * * *